(12) United States Patent
Mori

(10) Patent No.: US 11,366,164 B2
(45) Date of Patent: Jun. 21, 2022

(54) SWITCH CIRCUIT, SWITCH DEVICE, AND SYSTEM

(71) Applicant: ALPS ALPINE CO., LTD., Tokyo (JP)

(72) Inventor: Toshiharu Mori, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/151,847

(22) Filed: Jan. 19, 2021

(65) Prior Publication Data

US 2021/0141017 A1 May 13, 2021

Related U.S. Application Data

(63) Continuation of application No. PCT/JP2019/008918, filed on Mar. 6, 2019.

(30) Foreign Application Priority Data

Jul. 20, 2018 (JP) .............................. JP2018-136840

(51) Int. Cl.
*G01R 31/327* (2006.01)
*H01H 21/12* (2006.01)
(Continued)

(52) U.S. Cl.
CPC ......... *G01R 31/3277* (2013.01); *G01R 31/08* (2013.01); *H01H 21/12* (2013.01);
(Continued)

(58) Field of Classification Search
CPC .... G01R 31/3277; G01R 31/08; G01R 31/52; G01R 31/327; G01R 31/3278;
(Continued)

(56) References Cited

U.S. PATENT DOCUMENTS 4,651,138 A * 3/1987 Morrison ............. G08B 25/018
340/506
2002/0163171 A1* 11/2002 Kraft .................... B60N 2/2863
280/735
(Continued)

FOREIGN PATENT DOCUMENTS

CN 207232332 U * 4/2018
JP H04-051035 U 4/1992
(Continued)

OTHER PUBLICATIONS

International Search Report for PCT/JP2019/008918 dated Jun. 11, 2019.

*Primary Examiner* — Daniel R Miller

(74) *Attorney, Agent, or Firm* — IPUSA, PLLC

(57) ABSTRACT

A switch circuit includes a first circuit including a first switch and first output terminals, and a second circuit including a second switch and second output terminals. The first circuit and the second circuit are connected in series. The first circuit has a circuit configuration in which a combination of resistors in a signal path between the first output terminals of the first circuit differs depending on the electrical conduction state of the first switch. The second circuit has a circuit configuration in which a combination of
(Continued)

resistors in a signal path between the second output terminals of the second circuit differs depending on the electrical conduction state of the second switch.

6 Claims, 17 Drawing Sheets

(51) Int. Cl.
| | |
|---|---|
| *H01H 21/02* | (2006.01) |
| *G01R 31/08* | (2020.01) |
| *B60Q 9/00* | (2006.01) |
| *B60R 16/023* | (2006.01) |
| *H01H 21/08* | (2006.01) |
| *H01H 21/24* | (2006.01) |
| *H01H 21/56* | (2006.01) |

(52) U.S. Cl.
CPC ............ *B60Q 9/00* (2013.01); *B60R 16/0232* (2013.01); *H01H 21/025* (2013.01); *H01H 21/08* (2013.01); *H01H 21/24* (2013.01); *H01H 21/56* (2013.01)

(58) Field of Classification Search
CPC ...... H01H 21/12; H01H 21/025; H01H 21/08; H01H 21/24; H01H 21/56; H01H 9/54; H01H 13/18; B60Q 9/00; B60R 16/0232
See application file for complete search history.

(56) References Cited

U.S. PATENT DOCUMENTS

| | | | |
|---|---|---|---|
| 2010/0198464 A1* | 8/2010 | Jones ................. | H01H 36/0006 |
| | | | 701/45 |
| 2018/0143250 A1* | 5/2018 | Nowicki ............ | G01R 31/3277 |

FOREIGN PATENT DOCUMENTS

| | | |
|---|---|---|
| JP | H05-028872 | 2/1993 |
| JP | 2000-173428 | 6/2000 |
| JP | 2002-122626 | 4/2002 |
| JP | 2007-252082 | 9/2007 |
| JP | 2015-072894 | 4/2015 |

\* cited by examiner

SWITCH CIRCUIT, SWITCH DEVICE, AND SYSTEM

CROSS-REFERENCE TO RELATED APPLICATIONS

This application is a continuation of International Application No. PCT/JP2019/008918, filed on Mar. 6, 2019 and designating the U.S., which claims priority to Japanese Patent Application No. 2018-136840 filed on Jul. 20, 2018. The contents of these applications are incorporated herein by reference in their entirety.

BACKGROUND OF THE INVENTION

1. Field of the Invention

The disclosures herein relate to a switch circuit, a switch device, and a system.

2. Description of the Related Art

For example, Patent Document 1 below describes a switch device in which two resistors are connected in series in a circuit. This configuration allows an external device to detect the resistance value of the switch device in order to identify a failure such as a disconnection or a short circuit of a connection member connected to the external device.

However, switch devices according to the related art cannot detect malfunctions (such as a disconnection and a short circuit due to a switch being unable to return to the initial state) of a switch provided in the switch device. For example, it is conceived that the switch device may include two switches for redundancy. In this case, if one switch malfunctions, the malfunction of the one switch may be detected based on the operation of the other switch. However, with this approach, external cables need to be connected to the both switches. Therefore, the number of terminals and the number of cables may increase, and as a result, the cost and weight of the switch device may increase.

RELATED-ART DOCUMENTS

Patent Documents

Patent Document 1: Japanese Laid-Open Patent Publication No. 2015-72894

SUMMARY OF THE INVENTION

According to at least one embodiment, a switch circuit includes a first circuit including a first switch and first output terminals, and a second circuit including a second switch and second output terminals. The first circuit and the second circuit are connected in series. The first circuit has a circuit configuration in which a combination of resistors in a signal path between the first output terminals of the first circuit differs depending on the electrical conduction state of the first switch. The second circuit has a circuit configuration in which a combination of resistors in a signal path between the second output terminals of the second circuit differs depending on the electrical conduction state of the second switch.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
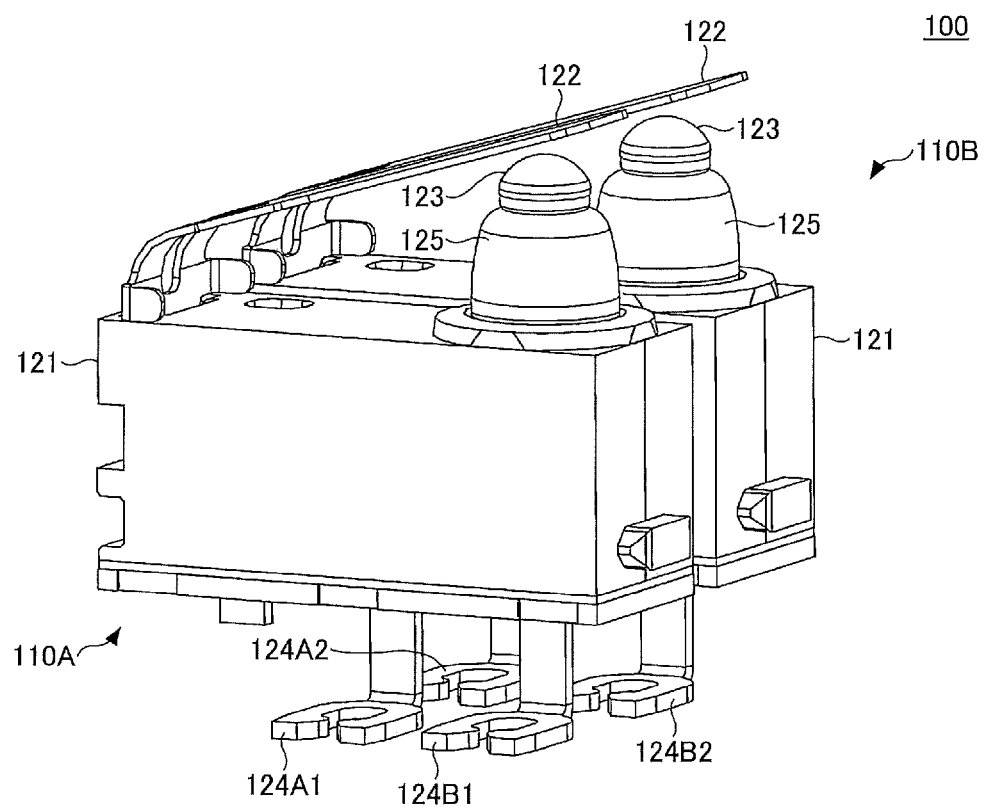
FIG. 1 is a perspective view of the exterior of a switch device according to an embodiment.

According to at least one embodiment, a switch device that is capable of determining a failure, including a malfunction of a switch, without increasing the number of output terminals and the number of cables can be provided.

In the following, embodiments of the present invention will be described with reference to the accompanying drawings. In the drawings, a Z-axis direction (a direction in which an operation member 123 slides) is referred to as a vertical direction, and an X-axis direction and a Y-axis direction (directions perpendicular to the direction in which the operation member 123 slides) are referred to as horizontal directions, for the sake of convenience.

(Overview of Switch Device 100)

Figure 2:
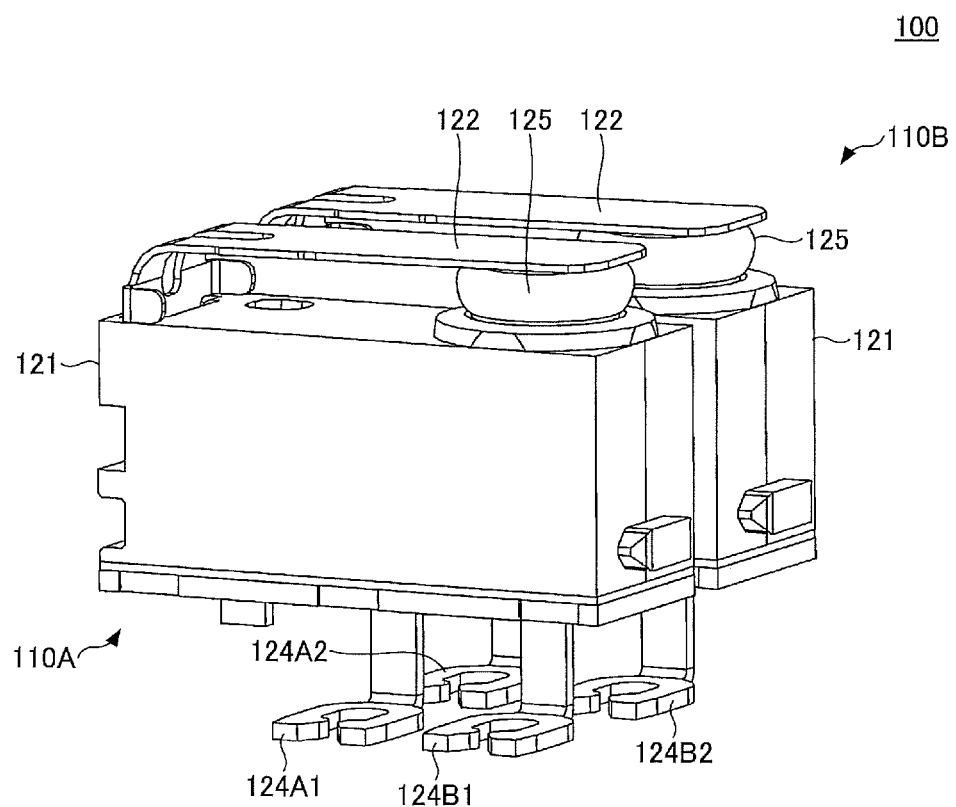
FIG. 2 is a perspective view of the exterior of the switch device according to the embodiment.

FIG. 1 and FIG. 2 are perspective views of the exterior of a switch device 100 according to an embodiment. The switch device 100 illustrated in FIG. 1 and FIG. 2 is a vehicle switch device. The switch device 100 switches between an off-state and an on-state in accordance with the movement of a detection object present in a vehicle. In this manner, the switch device 100 can detect the state of the detection object. The switch device 100 may be waterproof, and is, in such a case, suitable for use outside the vehicle. For example, the switch device 100 can be used as an open/close detection device configured to detect the open/close state of a hood, doors, a trunk, or the like of the vehicle.

As illustrated in FIG. 1 and FIG. 2, the switch device 100 includes a first switch 110A and a second switch 110B. The first switch 110A and the second switch 110B have similar configurations. The first switch 110A and the second switch 110B may be hereinafter collectively referred to as a "switch 110" unless the first switch 110A and the second switch 110B need to be distinguished from each other.

The switch 110 includes a case 121 having a rectangular parallelepiped shape. A lever 122, an operation member 123, and a cover 125 are provided on the upper surface of the case 121. In addition, two output terminals 124A and 124B are disposed to protrude from the bottom of the case 121. Note that the two output terminals 124A and 124B are referred to as two output terminals 124A1 and 124B1 in the first switch 110A, and the two output terminals 124A and 124B are referred to as two output terminals 124A2 and 124B2 in the second switch 110B.

As illustrated in FIG. 2, the switch device 100 is used such that the lever 122 of the first switch 110A and the lever 122 of the second switch 110B are pressed down at the same time in accordance with the movement of a detection object (such as a vehicle hood).

In each of the first switch 110A and the second switch 110B, upon the lever 122 being pressed down, the lever 122 presses the operation member 123 while squeezing the cover 125. As a result, each of the first switch 110A and the second switch 110B enters the on-state, and the two output terminals 124A and 124B are electrically connected to each other.

The switch device 100 has a circuit configuration in which a first circuit 120A (see FIG. 6) of the first switch 110A and a second circuit 120B (see FIG. 6) of the second switch 110B are connected in series by connecting the output terminal 124B1 of the first switch 110A to the output terminal 124A2 of the second switch 110B through a given connecting method.

(Configuration of Switch Device 100)

Figure 3:
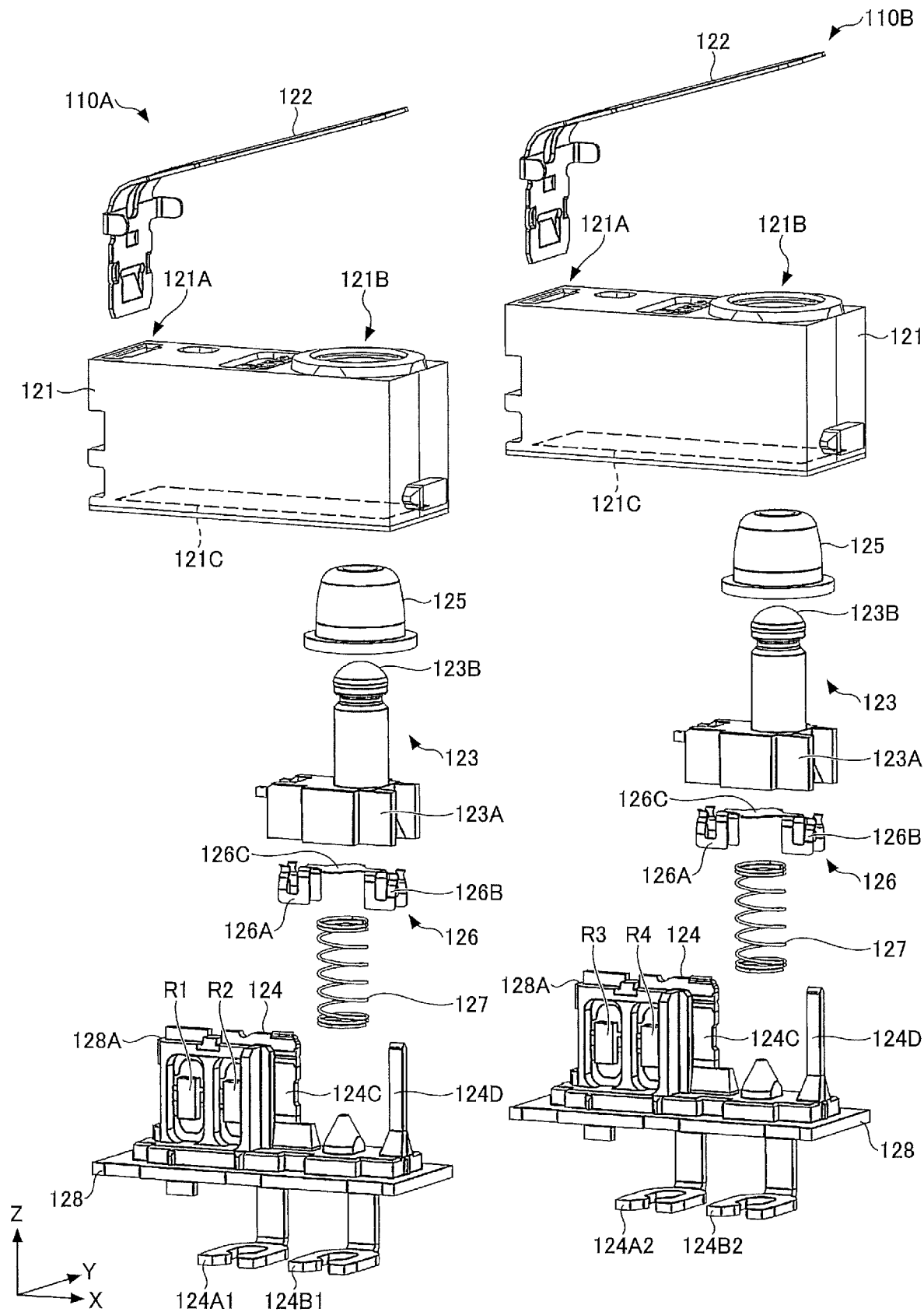
FIG. 3 is an exploded perspective view of the switch device according to the embodiment.

FIG. 3 is an exploded perspective view of the switch device 100 according to the embodiment. As illustrated in FIG. 3, each of the first switch 110A and the second switch 110B includes the lever 122, the case 121, the cover 125, the operation member 123, a movable contact 126, a spring 127, a terminal member 124, and a wafer 128 in this order from top to bottom.

The lever 122 is a thin plate-shaped member having a spring characteristic. The lever 122 extends above the case 121 in the longitudinal direction (in the X-axis direction) of the case 121. For example, the lever 122 is formed by processing a metal plate having a spring characteristic, such as a stainless steel plate. One end portion (on the negative-X side) of the lever 122 is secured to the case 121 by being inserted into a support hole 121A formed on the upper surface of the case 121. The other end portion (on the positive-X side) of the lever 122 is located above the operation member 123. Pressing the other end portion of the lever 122 down causes the operation member 123 to be pressed down.

The case 121 is a container member having an approximately rectangular parallelepiped shape. The case 121 has a lower-side opening 121C at the bottom, and the components (the cover 125, the operation member 123, the movable contact 126, the spring 127, the terminal member 124, and the wafer 128) can be assembled through the lower-side opening 121C into the case 121. For example, the case 121 may be formed of a relatively rigid insulating material (such as a synthetic resin). The support hole 121A and a through hole 121B are formed on the upper surface of the case 121. The one end portion of the lever 122 is inserted into and is supported by the support hole 121A, and the operation member 123 and the cover 125 are inserted into the through hole 121B.

The cover 125 covers an operation portion 123B of the operation member 123, and is inserted into the through hole 121B, formed on the upper surface of the case 121, together with the operation portion 123B. In this manner, a gap between the operation portion 123B and the through hole 121B can be filled, and water can be prevented from entering the case 121. For example, the cover 125 may be formed of an elastic material such as rubber or silicone.

The operation member 123 is a member configured to slide down by being pressed down by the lever 122 so as to change the switch 110 to the on-state. The operation member 123 includes a slide portion 123A configured to slide in the vertical direction within the case 121, and includes the operation portion 123B having a columnar shape and extending upward from the upper surface of the slide portion 123A. The operation portion 123B passes through the through hole 121B, formed on the upper surface of the case 121, and protrudes above the upper surface of the case 121. With this configuration, the operation portion 123B can be pressed down, and pressing the operation portion 123B down causes the slide portion 123A to slide down. For example, the operation member 123 may be formed of a relatively rigid insulating material (such as a synthetic resin).

The movable contact 126 is provided within the case 121 and below the operation member 123, and is configured to slide in the vertical direction. The movable contact 126 includes a connection portion 126C having a flat plate shape, and includes a clip portion 126A and a clip portion 126B on both ends (in the X-axis direction) of the connection portion 126C. The clip portion 126A slides in the vertical direction along a first contact 124C of the terminal member 124 while sandwiching the first contact 124C. The clip portion 126B slides in the vertical direction along a second contact 124D of the terminal member 124 while sandwiching the second contact 124D. For example, the movable contact 126 may be formed of a metal plate that is electrically conductive and has a spring characteristic. The movable contact 126 contacts the second contact 124D and does not contact the first contact 124C when the operation member 123 is not pressed down, thereby preventing the first contact 124C from becoming electrically connected to the second contact 124D. Conversely, upon the operation member 123 being pressed, the movable contact 126 moves down together with the operation member 123, and contacts the first contact 124C and the second contact 124D, thus causing the first contact 124C and the second contact 124D to be electrically connected to each other.

The spring 127 is what is known as a coil spring that is provided between the connection portion 126C and the wafer 128 and is elastically deformable in the vertical direction. The spring 127 is compressed by the movable contact 126 that moves together with the operation member 123 upon the operation member 123 being pressed down. When the operation member 123 is released, the spring 127 is subjected to an elastic return force, thereby causing the movable contact 126 and the operation member 123 to be moved up and return to the initial state.

The terminal member 124 is a member constituting a circuit pattern of the switch 110. For example, the terminal member 124 is formed by processing (such as punching or bending) an electrically conductive metal plate. The terminal member 124 includes the first contact 124C, the second contact 124D, and the output terminals 124A and 124B. Note that the terminal member 124 includes resistors R1 and R2 in the first switch 110A, and the terminal member 124 includes resistors R3 and R4 in the second switch 110B. Details of the terminal member 124 of each of the first switch 110A and the second switch 110B will be described below with reference to FIG. 4 and FIG. 5. In the present embodiment, the resistor R1, the resistor R2, the resistor R3, and the resistor R4 each have a different resistance value. Accordingly, the resistance value of the switch device 100 varies in accordance with the location of a failure in the switch device 100, thus allowing the failure to be readily identified.

The wafer 128 is a flat plate-shaped member that is attached to the bottom of the case 121 and closes the lower-side opening 121C of the case 121. A support wall 128A is provided on the upper surface of the wafer 128, and supports the terminal member 124 in a standing state.

In the switch device 100 according to the present embodiment, each of the first switch 110A and the second switch 110B includes the case 121. However, the present invention is not limited thereto, and the switch device 100 may include one case in which the components of the first switch 110A and the components of the second switch 110B are assembled. In this case, the output terminal 124B1 of the first switch 110A and the output terminal 124A2 of the second switch 110B may be integrally formed within the case.

(Configuration of Terminal Member 124)

Figure 4:
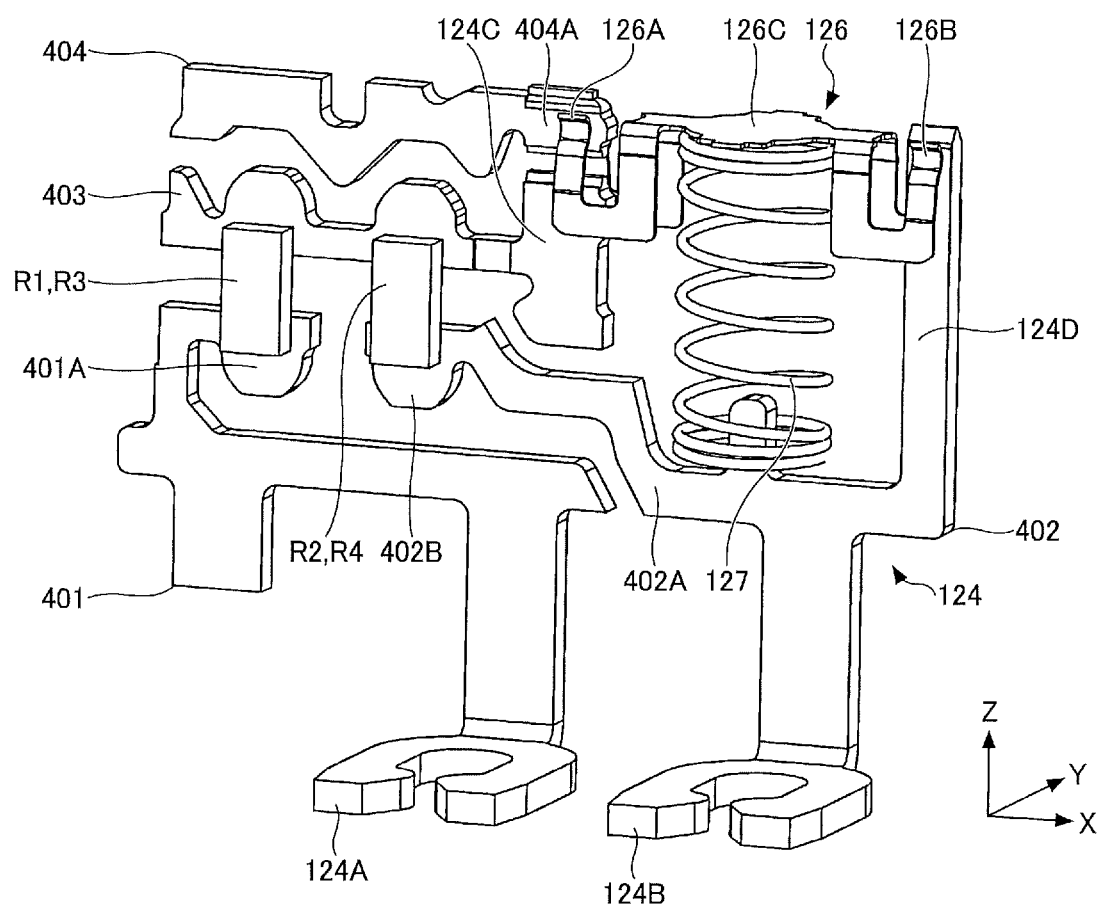
FIG. 4 is a perspective view of an exterior of a terminal member included in the switch device according to the embodiment.
Figure 5:
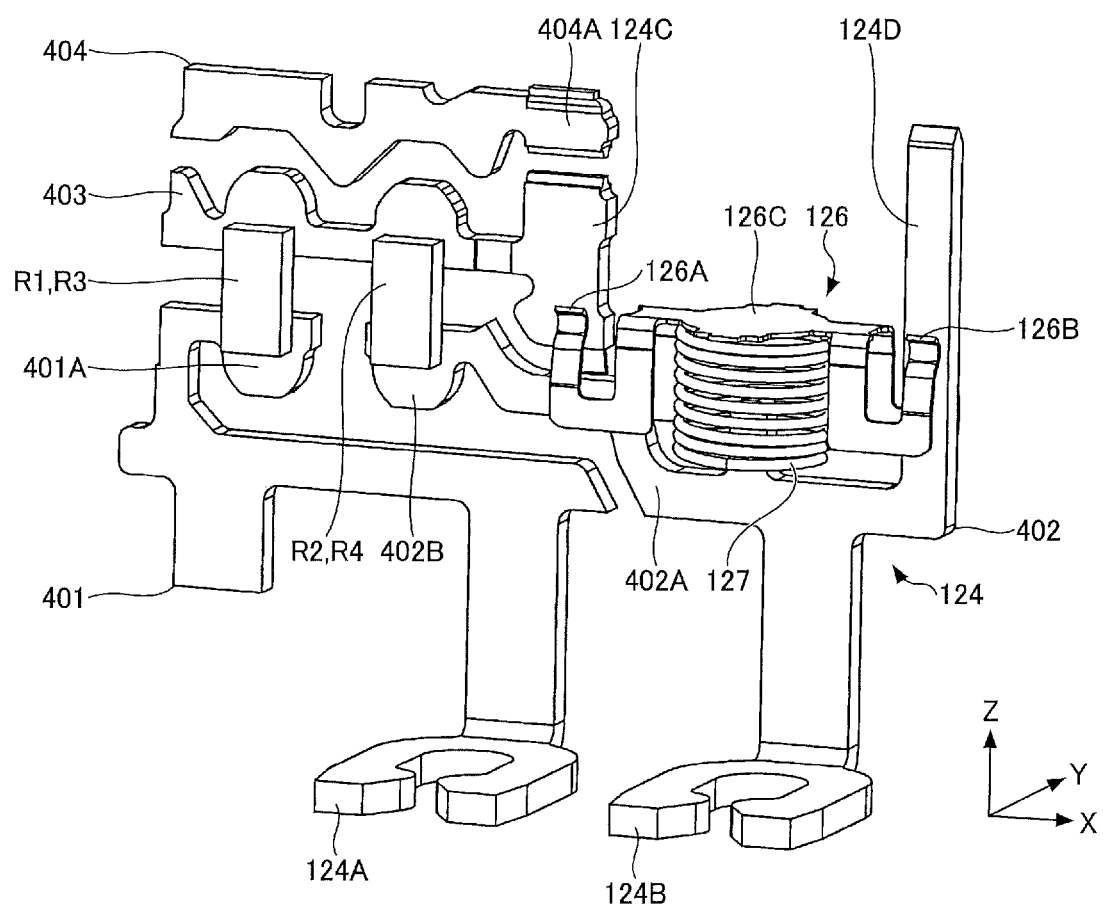
FIG. 5 is a perspective view of the exterior of the terminal member included in the switch device according to the embodiment.

FIG. 4 and FIG. 5 are perspective views of the exterior of the terminal member 124 included in the switch device 100 according to the embodiment. FIG. 4 and FIG. 5 depict the movable contact 126 and the spring 127 together with the terminal member 124. FIG. 4 depicts the off-state of the switch device 100, and FIG. 5 depicts the on-state of the switch device 100.

As illustrated in FIG. 4 and FIG. 5, the terminal member 124 includes a first component 401, a second component 402, a third component 403, and a fourth component 404 in the same plane (in the XZ plane). The first component 401, the second component 402, the third component 403, and the fourth component 404 are formed separately from each other by processing an electrically conductive metal plate.

The output terminal 124A is provided at the lower end of the first component 401. The output terminal 124A protrude below the bottom surface of the wafer 128, and is connected to an external device. Further, a connection portion 401A is provided at the upper end of the first component 401, and is connected to the third component 403.

The second component 402 is provided alongside the first component 401 in the longitudinal direction (in the X-axis direction) of the switch device 100. The output terminal 124B is provided at the lower end of the second component 402. The output terminal 124B protrudes below the bottom surface of the wafer 128, and is connected to an external device. In addition, the second component 402 includes an extending portion 402A that extends below the spring 127 to a position aligned with the connection portion 401A of the first component 401 in the longitudinal direction (in the X-axis direction) of the switch device 100. A connection portion 402B is provided at the tip of the extending portion 402A (that is, at the position aligned with the connection portion 401A), and is connected to the third component 403. Further, the second component 402 includes the second contact 124D that is provided on the side (on the positive X-side) of the spring 127 and that extends linearly in the vertical direction. The second contact 124D is sandwiched by the clip portion 126B of the movable contact 126, and the clip portion 126B slides in the vertical direction while sandwiching the second contact 124D.

The third component 403 is located above and away from the connection portion 401A of the first component 401 and the connection portion 402B of the second component 402, and extends approximately linearly in the longitudinal direction (in the X-axis direction) of the switch device 100. The third component 403 is connected to the connection portion 401A by the resistor R1 (or the resistor R3). In addition, the third component 403 is connected to the connection portion 402B by the resistor R2 (or the resistor R4). The first contact 124C, extending linearly in the vertical direction, is provided at the end (on the positive X-side) of the third component 403. The first contact 124C is sandwiched by the clip portion 126A of the movable contact 126. The clip portion 126A slides in the vertical direction while sandwiching the first contact 124C such that the switch device 100 enters the on-state.

The fourth component 404 is located above and away from the third component 403, and extends approximately linearly in the longitudinal direction (X-axis direction) of the switch device 100. A support portion 404A is provided at the end (on the positive X-side) of the fourth component 404. The support portion 404A is located above and away from the first contact 124C of the third component 403. When the switch device 100 is in the off-state, the support portion 404A is sandwiched by the clip portion 126A of the movable contact 126, and supports the clip portion 126A.

As illustrated in FIG. 4, when the operation member 123 is not pressed down, the clip portion 126A of the movable contact 126 contacts the second contact 124D and does not contact the first contact 124C. In this state, the first contact 124C and the second contact 124D are not electrically connected to each other, and thus, the switch device 100 is in the off-state.

Conversely, as illustrated in FIG. 5, upon the operation member 123 being pressed down, the clip portion 126A of the movable contact 126 contacts both the first contact 124C and the second contact 124D, thereby causing the first contact 124C and the second contact 124D to be electrically connected to each other. Thus, the switch device 100 is in the on-state.

(Circuit Configuration of Switch Device 100)

Figure 6:
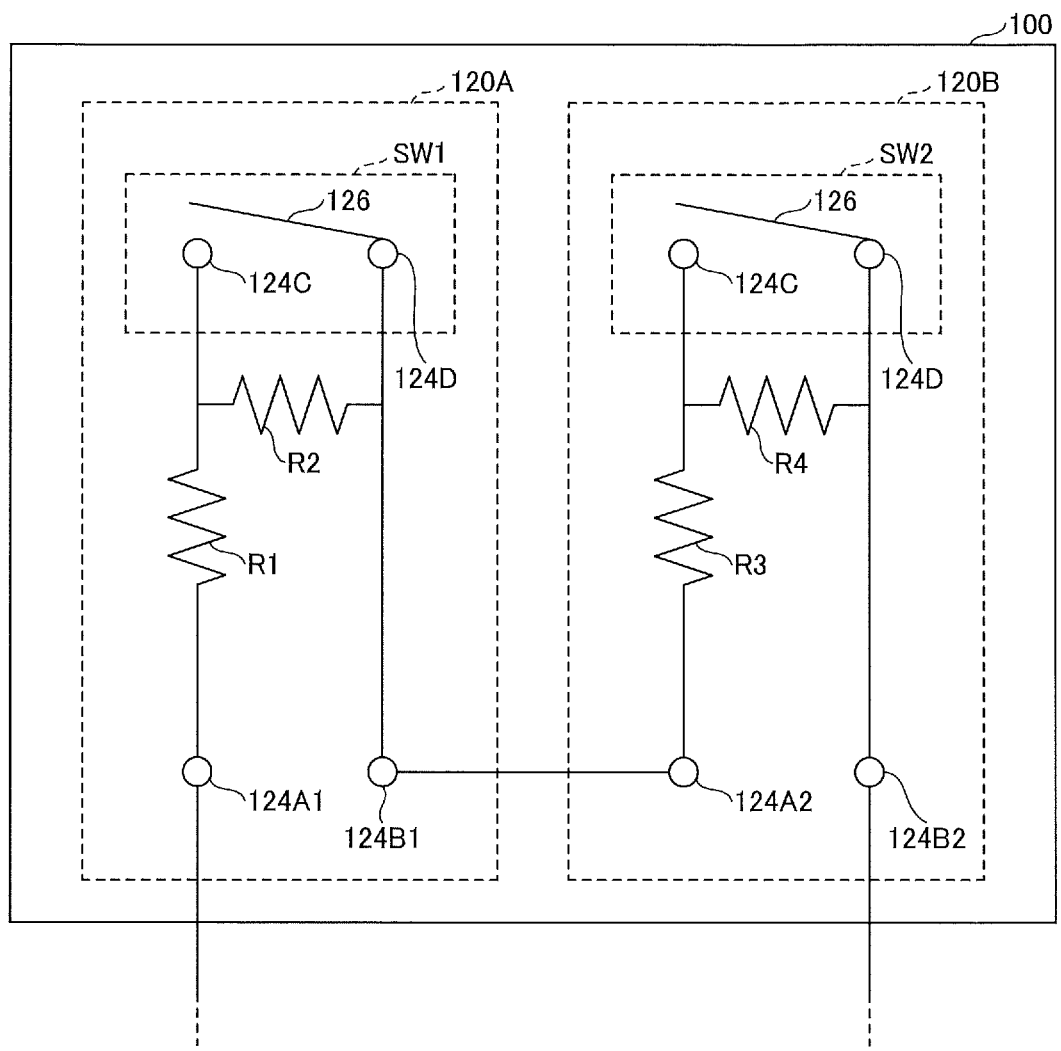
FIG. 6 is a diagram illustrating a circuit configuration of the switch device according to the embodiment.

FIG. 6 is a diagram illustrating a circuit configuration of the switch device 100 according to the embodiment. As illustrated in FIG. 6, the switch device 100 has a circuit configuration in which the first circuit 120A of the first switch 110A and the second circuit 120B of the second switch 110B are connected in series.

The first circuit 120A includes the output terminal 124A1, the output terminal 124B1, a switch SW1, the resistor R1, and the resistor R2. The switch SW1 includes the first contact 124C and the second contact 124D of the terminal member 124, and the movable contact 126.

The output terminal 124A1 is connected to the first contact 124C of the switch SW1 via the resistor R1. In addition, the output terminal 124A1 serves as an output terminal of the switch device 100, and is connected to an external device. The output terminal 124B1 is connected to the second contact 124D of the switch SW1. In addition, the output terminal 124B1 is connected to the output terminal 124A2 of the second circuit 120B.

One end of the resistor R1 is connected to the output terminal 124A1, and the other end of the resistor R1 is connected to the first contact 124C of the switch SW1 and to the resistor R2. That is, the resistor R1 is connected in series with the switch SW1 and with the resistor R2.

One end of the resistor R2 is connected between the resistor R1 and the first contact 124C of the switch SW1, and the other end of the resistor R2 is connected between the second contact 124D of the switch SW1 and the output terminal 124B1. That is, the resistor R2 is connected in parallel with the switch SW1.

Accordingly, the first circuit 120A has a circuit configuration in which a combination of resistors in a signal path between the output terminals 124A1 and 124B1 differs depending on the electrical conduction state of the switch SW1. Specifically, when the switch SW1 is in the on-state, the resistance value between the output terminals 124A1 and 124B1 is "R1". When the switch SW1 is in the off-state, the resistance value between the output terminals 124A1 and 124B1 is "R1+R2".

The second circuit 120B includes the output terminal 124A2, the output terminal 124B2, a switch SW2, the resistor R3, and the resistor R4. The switch SW2 includes the first contact 124C and the second contact 124D of the terminal member 124, and the movable contact 126.

The output terminal 124A2 is connected to the first contact 124C of the switch SW1 via the resistor R3. In addition, the output terminal 124A2 is connected to the output terminal 124B1 of the first circuit 120A. The output terminal 124B2 is connected to the second contact 124D of the switch SW2. In addition, the output terminal 124B2 serves as an output terminal of the switch device 100, and is connected to an external device.

One end of the resistor R3 is connected to the output terminal 124A2, and the other end of the resistor R3 is connected to the first contact 124C of the switch SW2 and to the resistor R4. That is, the resistor R3 is connected in series with the switch SW2 and with the resistor R4.

One end of the resistor R4 is connected between the resistor R3 and the first contact 124C of the switch SW2, and the other end of the resistor R4 is connected between the second contact 124D of the switch SW2 and the output terminal 124B2. That is, the resistor R4 is connected in parallel with the switch SW2.

Accordingly, the second circuit 120B has a circuit configuration in which a combination of resistors in a signal path between the output terminals 124A2 and 124B2 differs depending on the electrical conduction state of the switch SW2. Specifically, when the switch SW2 is in the on-state, the resistance value between the output terminals 124A2 and 124B2 is "R3". When the switch SW2 is in the off-state, the resistance value between the output terminals 124A2 and 124B2 is "R3+R4".

In the switch device 100 having the circuit configuration illustrated in FIG. 6, pressing the operation member 123 down causes the switch SW1 and the switch SW2 to switch to the on-state at the same time. In this state, the resistance value between the output terminal 124A1 and the output terminal 124B2 of the switch device 100 is "R1+R3". That is, the switch device 100 is in the on-state. Further, upon the operation member 123 returning to the initial position, the switch SW1 and the switch SW2 switch to the off-state at the same time. In this state, the resistance value between the output terminal 124A1 and 124B2 is "R1+R2+R3+R4". That is, the switch device 100 is in the off-state.

(Example Configuration of System Using Switch Device 100)

Figure 7:
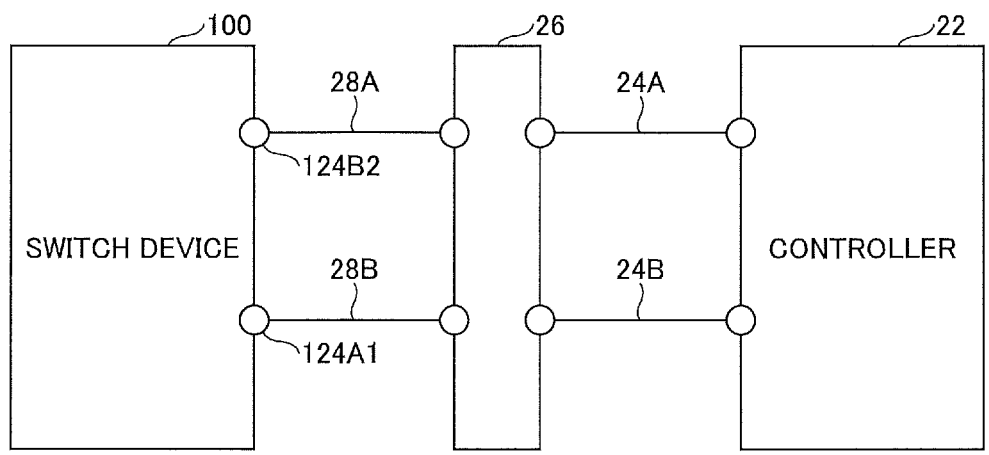
FIG. 7 is a diagram illustrating an example configuration of a system using the switch device according to the embodiment.

FIG. 7 is an example configuration of a system 20 using the switch device 100 according to the embodiment. As illustrated in FIG. 7, the system 20 includes the switch device 100 and a controller 22. The switch device 100 and the controller 22 are connected to each other by a cable 24A, a cable 24B, a connector 26, a cable 28A, and a cable 28B.

(Method for Detecting Failure by System 20)

A method for detecting a failure by the system 20 will be described with reference to FIG. 8 through FIG. 11. In the system 20 illustrated in FIG. 7, the controller 22 can detect a malfunction of the switches SW1 or SW2 or a failure in a signal path between the controller 22 and the switch the switch device 100 by determining the resistance value between the two output terminals 124A1 and 124B2.

For example, if there is no failure in the system 20, the resistance value (between the two output terminals 124A1 and 124B2) of the switch device 100 detected by the controller 22 is "R1+R2+R3+R4" when the switch device 100 is in the off-state, and is "R1+R3" when the switch device 100 is in the on-state. Accordingly, the controller 22 can detect the state of an object (such as the open/close state of a vehicle hood), and perform control (such as turning on a warning light or a limiting a certain function) in accordance with the detected state of the object.

Figure 8:
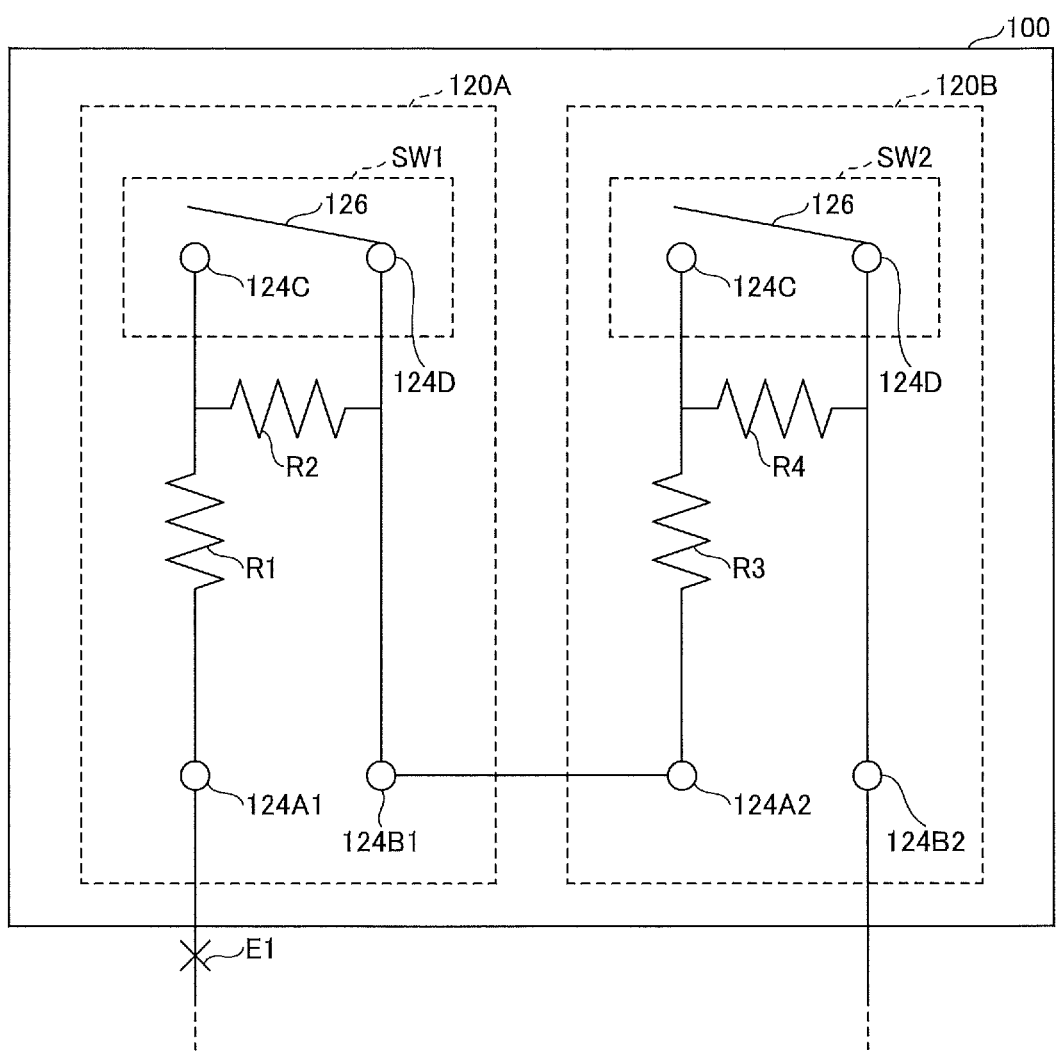
FIG. 8 is a diagram illustrating a first example of a failure location in the switch device according to the embodiment.

FIG. 8 is a diagram illustrating a first example of a failure location in the switch device 100 according to the embodiment. As illustrated in FIG. 8, if a disconnection E1 occurs in a signal path (such as the cable 24A, the cable 24B, the connector 26, the cable 28A, or the cable 28B) between the controller 22 and the switch device 100, the resistance value between the output terminal 124A1 and the output terminal 124B2 detected by the controller 22 is "∞ (open)". Based on this resistance value, the controller 22 determines that the disconnection E1 has occurred in the signal path between the controller 22 and the switch device 100.

Figure 9:
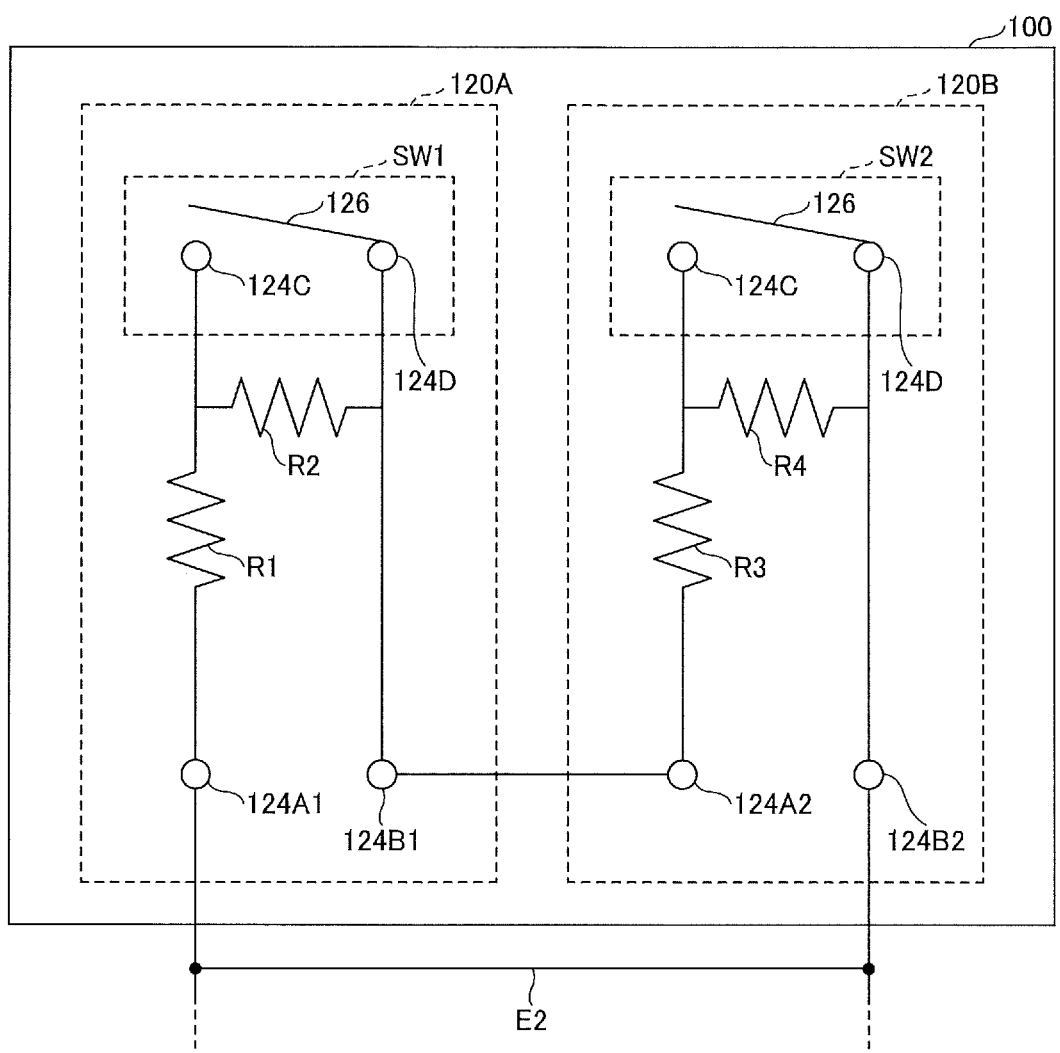
FIG. 9 is a diagram illustrating a second example of a failure location in the switch device according to the embodiment.

FIG. 9 is a diagram illustrating a second example of a failure location in the switch device 100 according to the embodiment. As illustrated in FIG. 9, if a short circuit E2 occurs in a signal path (such as the cable 24A, the cable 24B, the connector 26, the cable 28A, or the cable 28B) between the controller 22 and the switch device 100, the resistance value of the switch device 100 detected by the controller 22 is "0". Based on this resistance value, the controller 22 determines that the short circuit E2 has occurred in the signal path between the controller 22 and the switch device 100.

Figure 10:
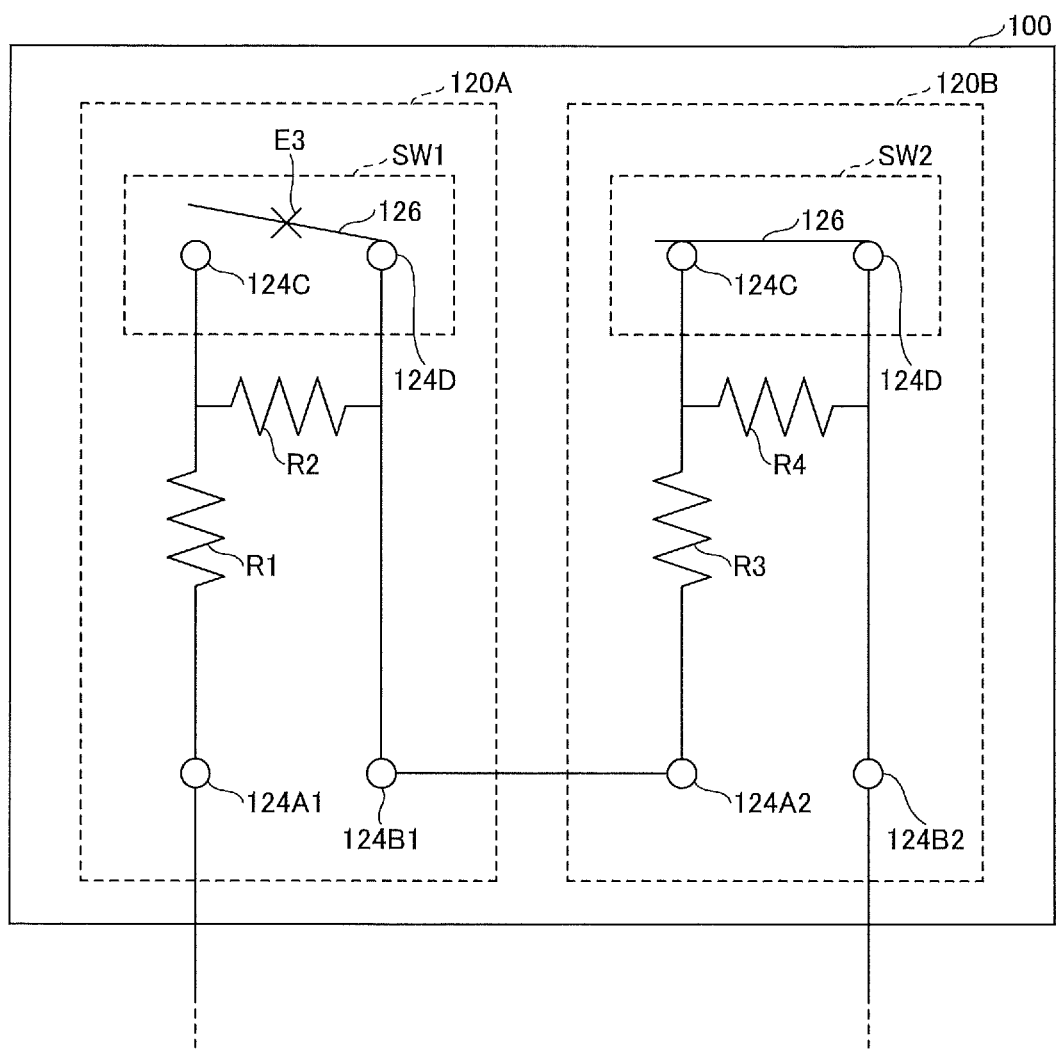
FIG. 10 is a diagram illustrating a third example of a failure location in the switch device according to the embodiment.

FIG. 10 is a diagram illustrating a third example of a failure location in the switch device 100 according to the embodiment. FIG. 10 depicts a circuit state in which the operation member 123 is being pressed down. As illustrated in FIG. 10, if one switch of the switches SW1 and SW2 is unable to switch to the on-state (due to a broken movable contact 126, a poor connection, or the like), the resistance value of the switch device 100 detected by the controller 22 is the sum of the resistance value between two resistors connected to the one switch, which is unable to switch to the on-state, and the resistance value of a resistor connected in series with the other switch, which has switched to the on-state.

In the example illustrated in FIG. 10, in the switch SW1, if a failure E3 that causes the switch SW1 to be unable to switch to the on-state occurs, the resistance value of the switch device 100 detected by the controller 22 is "R1+R2+R3". Based on this resistance value, the controller 22 determines that the switch SW1 is unable to switch to the on-state.

Further, if a failure that causes the switch SW2 to be unable to switch to the on-state occurs, the resistance value of the switch device 100 detected by the controller 22 is "R1+R3+R4". Based on this resistance value, the controller 22 determines that the switch SW2 is unable to switch to the on-state.

Figure 11:
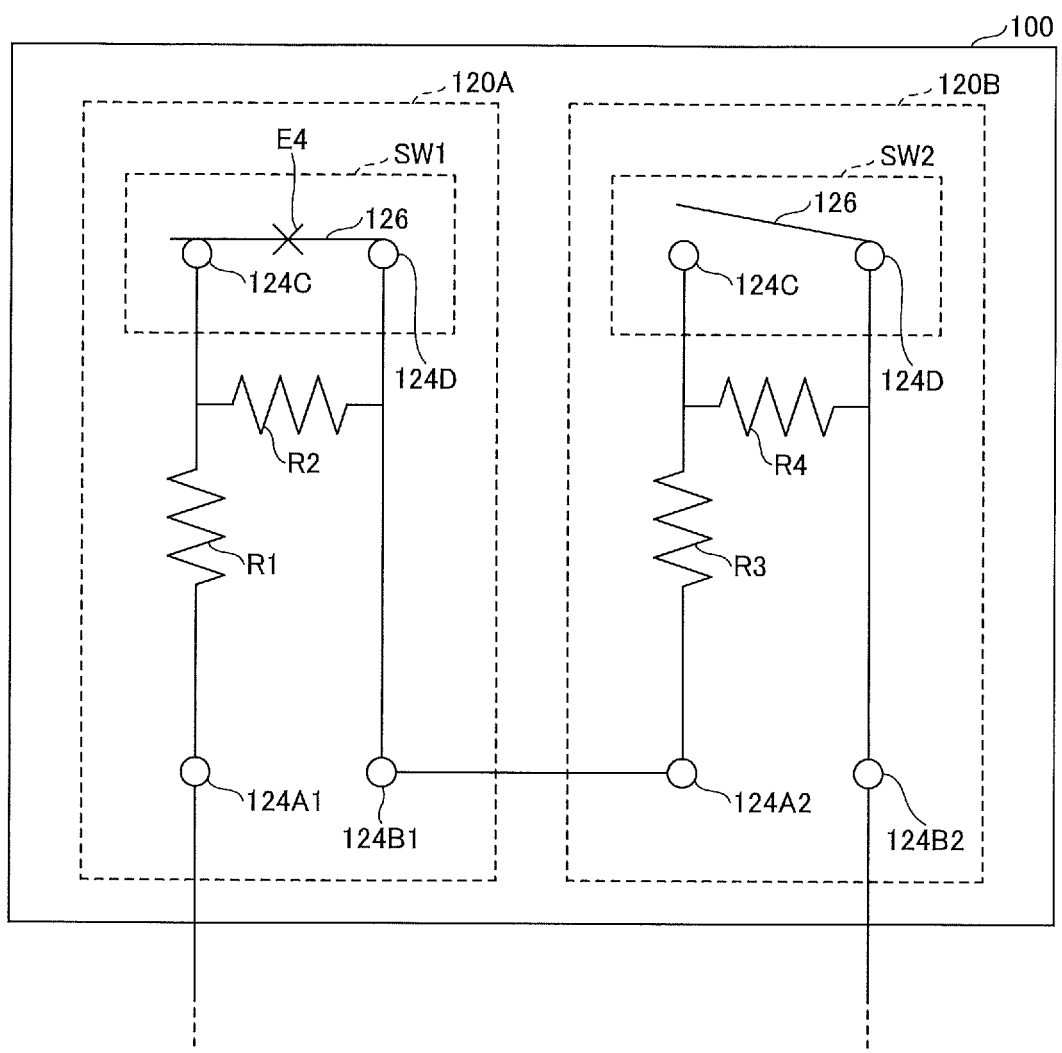
FIG. 11 is a diagram illustrating a fourth example of a failure location in the switch device according to the embodiment.

FIG. 11 is a diagram illustrating a fourth example of a failure location in the switch device 100 according to the embodiment. FIG. 11 depicts a circuit state in which the operation member 123 is not pressed down. As illustrated in FIG. 11, if one switch of the switches SW1 and SW2 is unable to return to the off-state (due to the stuck movable contact 126, for example), the resistance value of the switch device 100 detected by the controller 22 is the sum of the resistance value of two resistors connected to one switch of the switches SW1 and SW2, which has returned to the off-state, and the resistance value of a resistor connected in series with the other switch, which is unable to return to the off-state.

In the example illustrated in FIG. 11, if a failure E4 that causes the switch SW1 to be unable to return to the off-state occurs, the resistance value of the switch device 100 detected by the controller 22 is "R1+R3+R4". Based on this resistance value, the controller 22 determines that the switch SW1 is unable to return to the off-state.

Further, if a failure that causes the switch SW2 to be unable to return to the off-state occurs, the resistance value of the switch device 100 detected by the controller 22 is "R1+R2+R3". Based on this resistance value, the controller 22 determines that the switch SW2 is unable to return to the off-state.

As described above, the switch device 100 according to the embodiment includes a switch circuit that includes the first circuit 120A having the switch SW1 (first switch) and the second circuit 120B having the switch SW2 (second switch). In the switch circuit, the first circuit 120A and the second circuit 120B are connected in series, and the electrical conduction state of the switch SW1 and the electrical conduction state of the switch SW2 change at the same time in response to the operation of the operation member 123. The first circuit 120A has a circuit configuration in which a combination of resistors in a signal path between the output terminals 124A1 and 124B1 of the first circuit 120A differs depending on the electrical conduction state of the switch SW1. Further, the second circuit 120B has a circuit configuration in which a combination of resistors in a signal path between the output terminals 124A2 and 124B2 of the second circuit 120B differs depending on the electrical conduction state of the switch SW2.

Specifically, in the switch device 100 according to the embodiment, the first circuit 120A includes the resistor R1 connected in series with the switch SW1, and includes the resistor R2 connected in series with the resistor R1 and connected in parallel with the switch SW1. In addition, the second circuit 120B includes the resistor R3 connected in series with the switch SW2, and includes the resistor R4 connected in series with the resistor R3 and connected in parallel with the switch SW2.

Accordingly, in the switch device 100 according to the embodiment, the resistance value (between the output terminals 124A1 and 124B2) is "R1+R3" when the switch device 100 is in the on-state, and the resistance value is "R1+R2+R3+R4" when the switch device 100 is in the off-state.

Further, in the switch device 100 according to the embodiment, the resistance value is "∞ (open)" if a disconnection occurs in a signal path connected to the switch device 100, and the resistance value is "0" if a short circuit occurs in a signal path connected to the switch device 100.

Further, in the switch device 100 according to the embodiment, the resistance value is "R1+R2+R3" if a failure that causes the switch SW1 to be unable to switch to the on-state occurs, and the resistance value is "R1+R3+R4" if a failure that causes the switch SW2 to be unable to switch to the on-state occurs.

Further, in the switch device 100 according to the embodiment, the resistance value is "R1+R3+R4" if a failure that causes the switch SW1 to be unable to return to the off-state occurs, and the resistance value is "R1+R2+R3" a failure that causes the switch SW2 to be unable to return to the off-state occurs.

That is, in the switch device 100 according to the embodiment, an on-state, an off state, a disconnection in a signal path, a short circuit in a signal path, or a malfunction in each of the switches can be identified based on the resistance value between the two output terminals 124A1 and 124B2.

According to the embodiment, the switch device 100 that is capable of determining a failure, including a switch malfunction, without increasing the number of output terminals and the number of cables can be provided.

(Variation of Switch Device 100)

Figure 12:
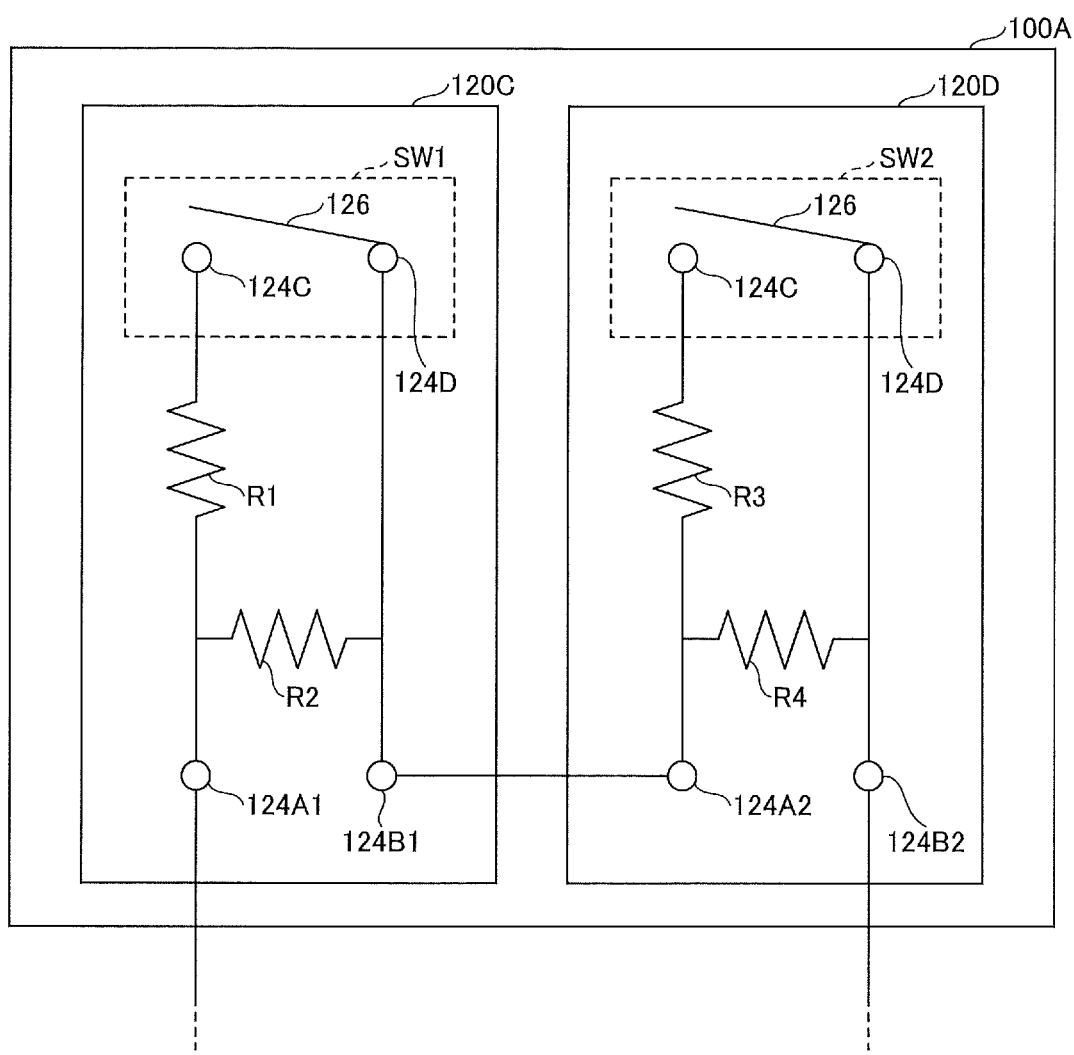
FIG. 12 is a diagram illustrating a variation of the switch device according to the embodiment.

FIG. 12 is a diagram illustrating a variation of the switch device 100 according to the embodiment. FIG. 12 depicts a circuit configuration of a switch device 100A that is a variation of the switch device 100. The switch device 100A includes a first switch 110C and a second switch 110D, instead of the first switch 110A and the second switch 110B. The first switch 110C has a circuit configuration different from that of the first switch 110A, but is otherwise the same as the first switch 110A. The second switch 110D has a circuit configuration different from that of the second switch 110B, but is otherwise the same as the second switch 110B.

As illustrated in FIG. 12, in a first circuit 120C, one end of the resistor R1 is connected to the output terminal 124A1, and the other end of the resistor R1 is connected to the first contact 124C of the switch SW1. That is, the resistor R1 is connected in series with the switch SW1.

In addition, one end of the resistor R2 is connected between the output terminal 124A1 and the resistor R1, and the other end of the resistor R2 is connected between the second contact 124D of the switch SW1 and the output terminal 124B1. That is, the resistor R2 is connected in parallel with the switch SW1 and the resistor R1 that are connected in series.

Accordingly, the first circuit 120C has a circuit configuration in which a combination of resistors in a signal path between the output terminals 124A1 and 124B1 differs depending on the electrical conduction state of the switch SW1. Specifically, when the switch SW1 is in the on-state, the resistance value between the output terminals 124A1 and 124B1 is "R1·R2/(R1+R2)". When the switch SW1 is in the off-state, the resistance value between the output terminals 124A1 and 124B1 is "R2".

Further, in a second circuit 120D, one end of the resistor R3 is connected to the output terminal 124A2, and the other end of the resistor R3 is connected to the first contact 124C of the switch SW2. That is, the resistor R3 is connected in series with the switch SW2.

In addition, one end of the resistor R4 is connected between the output terminal 124A2 and the resistor R3, and the other end of the resistor R4 is connected between the second contact 124D of the switch SW2 and the output terminal 124B2. That is, the resistor R4 is connected in parallel with the switch SW2 and the resistor R3 that are connected in series.

Accordingly, the second circuit 120B has a circuit configuration in which the combination of resistors in a signal path between the output terminals 124A2 and 124B2 differs depending on the electrical conduction state of the switch SW2. Specifically, when the switch SW2 is in the on-state, the resistance value between the output terminals 124A2 and 124B2 is "R3·R4/(R3+R4)". When the switch SW2 is in the off-state, the resistance value between the output terminals 124A2 and 124B2 is "R4".

In the switch device 100A having the circuit configuration illustrated in FIG. 12, pressing the operation member 123 down causes the switch SW1 and the switch SW2 to switch to the on-state at the same time. In this state, the resistance value between the output terminal 124A1 and the output terminal 124B2 of the switch device 100 is "R1·R2/(R1+R2)+R3·R4/(R3+R4)". That is, the switch device 100 is in the on-state. Further, upon the operation member 123 returning to the initial position, the switch SW1 and the switch SW2 switch to the off-state at the same time. In this state, the resistance value between the output terminal 124A1 and the output terminal 124B2 is "R2+R4". That is, the switch device 100 is in the off-state.

(Example Configuration of System Using Switch Device 100A)

Figure 13:
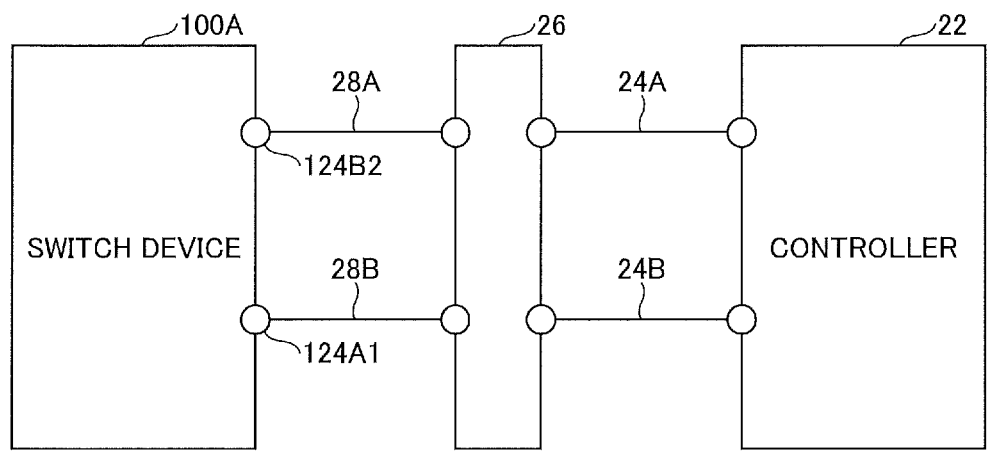
FIG. 13 is a diagram illustrating an example configuration of a system using a switch device according to a variation.

FIG. 13 is a diagram illustrating an example configuration of a system 20A using the switch device 100A according to the variation. As illustrated in FIG. 13, the system 20A includes the switch device 100A and the controller 22. The switch device 100A and the controller 22 are connected to each other by the cable 24A, the cable 24B, the connector 26, the cable 28A, and the cable 28B.

(Method for Detecting Failure by System 20A)

A method for detecting a failure by the system 20A will be described with reference to FIG. 14 through FIG. 17. In the system 20A illustrated in FIG. 13, the controller 22 can detect a malfunction of the switches SW1 or SW2 or failure in a signal path between the controller 22 and the switch device 100A by determining the resistance value between the two output terminals 124A1 and 124B2.

For example, if there is no failure in the system 20A, the resistance value (between the two output terminals 124A1 and 124B2) of the switch device 100A detected by the controller 22 is "R2+R4" when the switch device 100A is in the off-state, and is "R1·R2/(R1+R2)+R3·R4/(R3+R4)" when the switch device 100 is in the on-state. Accordingly, the controller 22 can detect the state of an object (such as the open/close state of a vehicle hood), and perform control in accordance with the detected state of the object.

Figure 14:
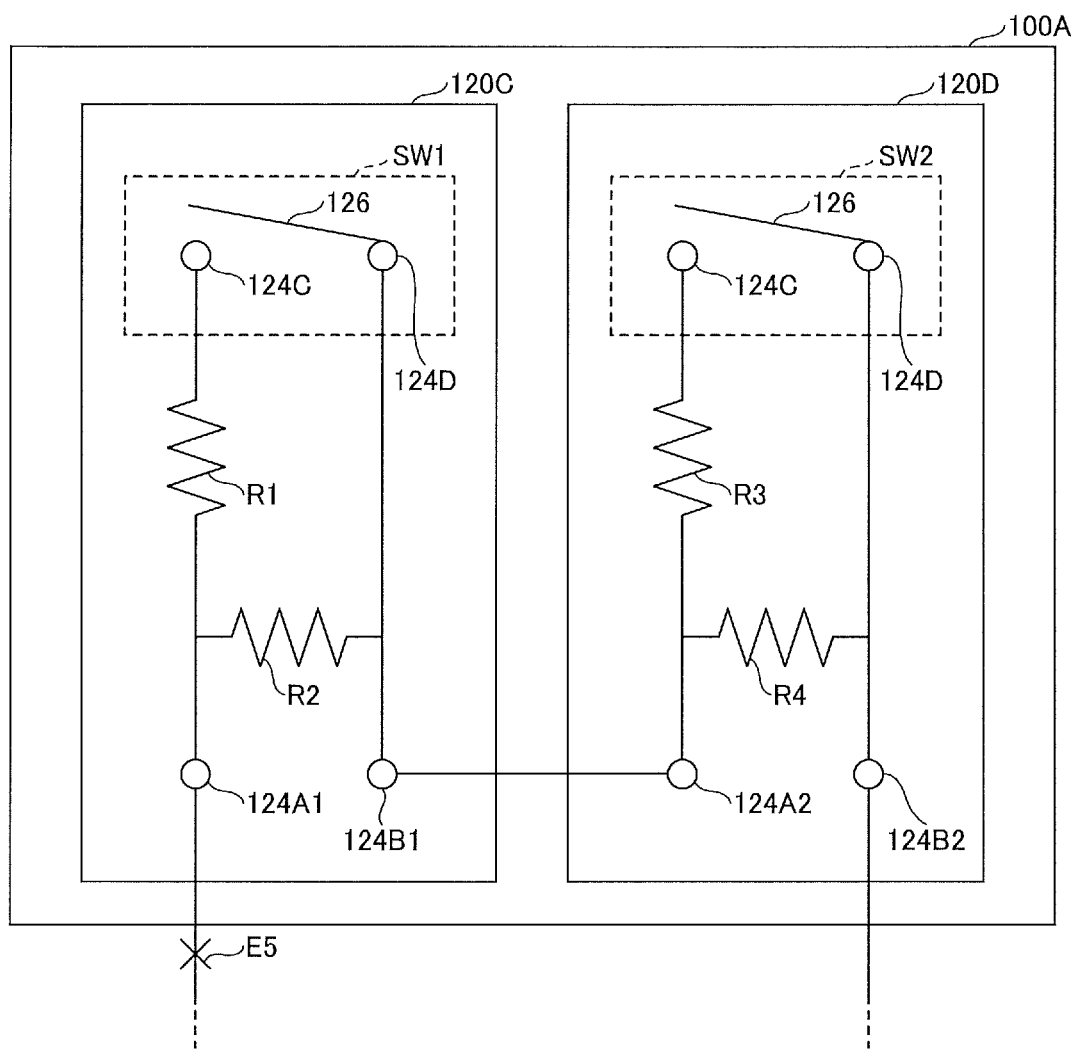
FIG. 14 is a diagram illustrating a first example of a failure location in the switch device according to the variation.

FIG. 14 is a diagram illustrating a first example of a failure location in the switch device 100A according to the variation. As illustrated in FIG. 14, if a disconnection E5 occurs in a signal path (such as the cable 24A, the cable 24B, the connector 26, the cable 28A, or the cable 28B) between the controller 22 and the switch device 100A, the resistance value of the switch device 100A detected by the controller 22 is "∞ (open)". Based on this resistance value, the controller 22 determines that the disconnection E5 has occurred in the signal path between the controller 22 and the switch device 100A.

Figure 15:
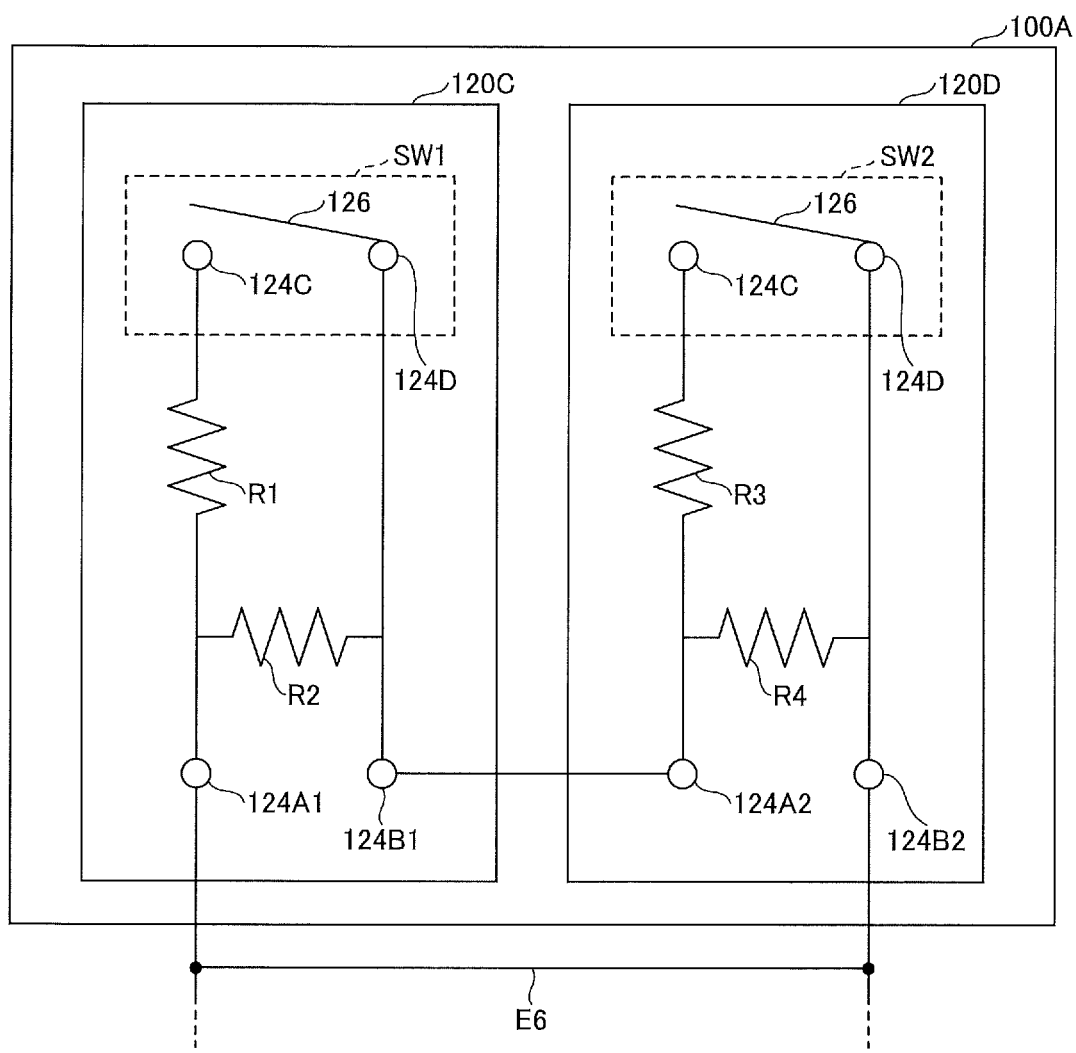
FIG. 15 is a diagram illustrating a second example of a failure location in the switch device according to the variation.

FIG. 15 is a diagram illustrating a second example of a failure location in the switch device 100A according to the variation. As illustrated in FIG. 15, if a short circuit E6 occurs in a signal path (such as the cable 24A, the cable 24B, the connector 26, the cable 28A, or the cable 28B) between the controller 22 and the switch device 100A, the resistance value of the switch device 100 detected by the controller 22 is "0". Based on this resistance value, the controller 22 determines that the short circuit E6 has occurred in the signal path between the controller 22 and the switch device 100A.

Figure 16:
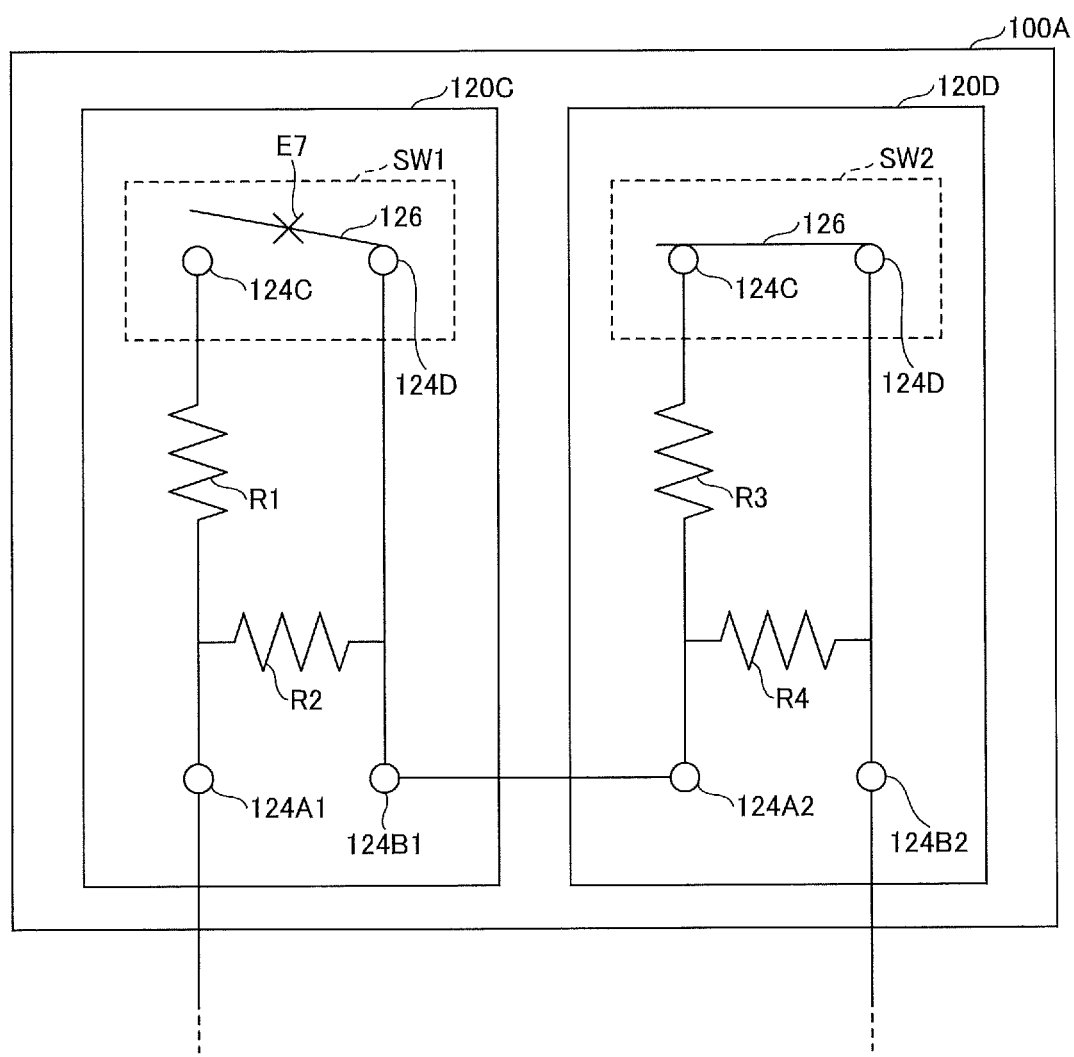
FIG. 16 is a diagram illustrating a third example of a failure location in the switch device according to the variation.

FIG. 16 is a diagram illustrating a third example of a failure location in the switch device 100A according to the variation. FIG. 16 depicts a circuit state in which the operation member 123 is being pressed down. As illustrated in FIG. 16, if one switch of the switches SW1 and SW2 is unable to switch to the on-state, the resistance value of the switch device 100A detected by the controller 22 is the sum of the resistance value of the one switch, obtained when the one switch is in the off-state, and the resistance value of the other switch, obtained when the other switch is in the on-state.

In the example illustrated in FIG. 16, if a failure E7 that causes the switch SW1 to be unable to switch to the on-state occurs, the resistance value of the switch device 100A detected by the controller 22 is "R2+R3·R4/(R3+R4)". Based on this resistance value, the controller 22 determines that the switch SW1 is unable to switch to the on-state.

Further, if a failure that causes the switch SW2 to be unable to switch to the on-state occurs, the resistance value of the switch device 100A detected by the controller 22 is "R1·R2/(R1+R2)+R4". Based on this resistance value, the controller 22 determines that the switch SW2 is unable to switch to the on-state.

Figure 17:
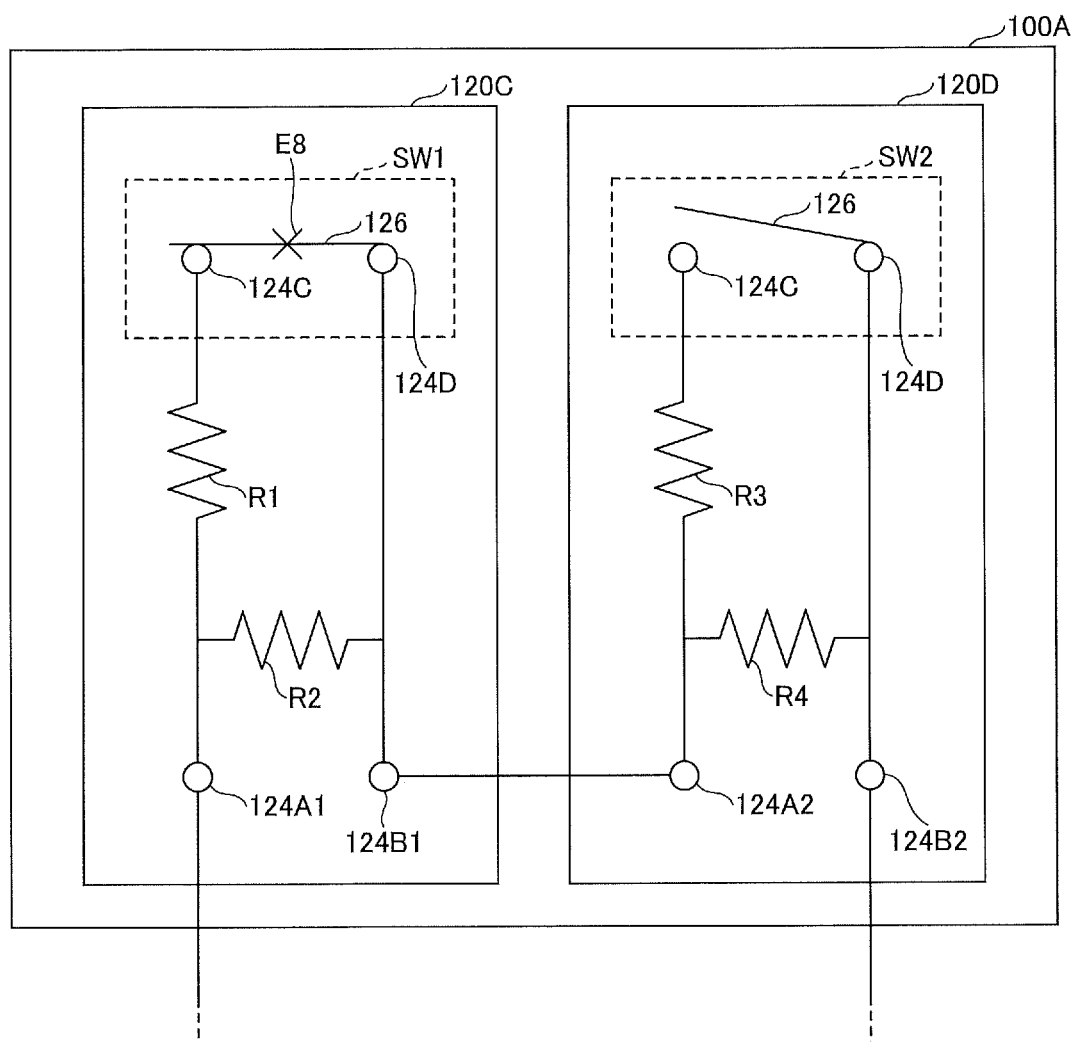
FIG. 17 is a diagram illustrating a fourth example of a failure location in the switch device according to the variation.

FIG. 17 is a diagram illustrating a fourth example of a failure location in the switch device 100A according to the variation. FIG. 17 depicts a circuit state in which the operation member 123 is not pressed down. As illustrated in FIG. 17, if one switch of the switches SW1 and SW2 is unable to return to the off-state, the resistance value of the switch device 100A detected by the controller 22 is the sum of the resistance value of the one switch, obtained when the one switch is in the off-state, and the resistance value of the other switch, obtained when the other switch is the off-state.

In the example illustrated in FIG. 17, if a failure E8 that causes the switch SW1 to be unable to return to the off-state occurs, the resistance value of the switch device 100A detected by the controller 22 is "R1·R2/(R1+R2)+R4". Based on this resistance value, the controller 22 determines that the switch SW1 is unable to return to the off-state.

Further, if a failure that causes the switch SW2 to be unable to return to the off-state occurs, the resistance value of the switch device 100 detected by the controller 22 is "R2+R3·R4/(R3+R4)". Based on this resistance value, the controller 22 determines that the switch SW2 is unable to return to the off-state.

As described above, the switch device 100A according to the variation includes a switch circuit that includes the first circuit 120C having the switch SW1 (first switch) and the second circuit 120D having the switch SW2 (second switch). In the switch circuit, the first circuit 120C and the second circuit 120D are connected in series, and the electrical conduction state of the switch SW1 and the electrical conduction state of the switch SW2 change at the same time in response to the operation of the operation member 123. The first circuit 120C has a circuit configuration in which a combination of resistors in a signal path between the output terminals 124A1 and 124B1 of the first circuit 120C differs depending on the electrical conduction state of the switch SW1. Further, the second circuit 120D has a circuit configuration in which a combination of resistors in a signal path between the output terminals 124A2 and 124B2 of the second circuit 120D differs depending on the electrical conduction state of the switch SW2.

Specifically, in the switch device 100A according to the variation, the first circuit 120C includes the resistor R1 connected in series with the switch SW1, and includes the resistor R2 connected in parallel with the switch SW1 and the resistor R1 that are connected in series. In addition, the second circuit 120D includes the resistor R3 connected in series with the switch SW2, and includes the resistor R4 connected in parallel with the switch SW2 and the resistor R3 that are connected in series.

Accordingly, in the switch device 100A according to the variation, the resistance value (between the output terminals 124A1 and 124B2) is "R1·R2/(R1+R2)+R3·R4/(R3+R4)" when the switch device 100A is in the on-state, and the resistance value is "R2+R4" when the switch device 100A is in the off-state.

Further, in the switch device 100A according to the variation, the resistance value is "∞ (open)" if a disconnection occurs in a signal path connected to the switch device 100A, and the resistance value is "0" if a short circuit occurs in a signal path connected to the switch device 100.

Further, in the switch device 100A according to the variation, the resistance value is "R2+R3·R4/(R3+R4)" if a failure that causes the switch SW1 to be unable to switch to the on-state occurs, and the resistance value is "R1·R2/(R1+R2)+R4" if a failure that causes the switch SW2 to be unable to switch to the on-state occurs.

Further, in the switch device 100A according to the variation, the resistance value is "R1·R2/(R1+R2)+R4" if a failure that causes the switch SW1 to be unable to return to the off-state occurs, and the resistance value is "R2+R3·R4/(R3+R4)" if a failure that causes to be unable to return to the off-state occurs.

That is, in the switch device 100A according to the variation, an on-state, an off state, a disconnection in a signal path, a short circuit in a signal path, or a malfunction in each of the switches can be identified based on the resistance value between the two output terminals 124A1 and 124B2.

According to the variation, a switch device 100A that is capable of determining a failure, including a switch malfunction, without increasing the number of output terminals and the number of cables can be provided.

Although the embodiment of the present invention has been described in detail above, the present invention is not limited to the particulars of the above-described embodiment. Variations and modifications may be made without departing from the scope of the subject matter recited in the claims.

For example, the switch devices 100 and 100A are not required to have the above-described configurations. Each of the switch devices 100 and 100A may have any configuration as long as a switch circuit in which a first circuit and a second circuit are connected in series is included.

Further, the first circuit and the second circuit of each of the switch devices 100 and 100A are not required to have the above-described circuit configurations. Each of the first circuit and the second circuit may have any circuit configuration as long as a combination of resistors in a signal path differs depending on the electrical conduction state of a corresponding switch.

Further, the switch SW1 and the switch SW2 in each of the switch devices 100 and 100A are configured to switch to the on-state at the same time. However, the timing at which the switch SW1 switches to the on-state may slightly differ from the timing at which the switch SW2 switches to the on-state as long as both the switch SW1 and the switch SW2 eventually switch to the on-state.

What is claimed is:

1. A switch circuit comprising:
a first circuit including a first switch and first output terminals; and
a second circuit including a second switch and second output terminals, wherein
the first circuit and the second circuit are connected in series,
the first circuit has a circuit configuration in which a combination of resistors in a signal path between the first output terminals of the first circuit differs depending on an electrical conduction state of the first switch,
the second circuit has a circuit configuration in which a combination of resistors in a signal path between the second output terminals of the second circuit differs depending on an electrical conduction state of the second switch,
the first switch and the second switch are arranged side-by-side to each other, and an operation member of each of the first switch and the second switch is disposed on a same side in the side-by-side arrangement of the first switch and the second switch, and
the electrical conduction state of the first switch and the electrical conduction state of the second switch are simultaneously changed in response to a simultaneous operation of the operation member of the first switch and the second switch by a detection object.

2. The switch circuit according to claim 1, wherein
the first circuit includes a first resistor that is connected in series with the first switch, and includes a second resistor that is connected in series with the first resistor and that is connected in parallel with the first switch, and
the second circuit includes a third resistor that is connected in series with the second switch, and includes a fourth resistor that is connected in series with the third resistor and that is connected in parallel with the second switch.

3. The switch circuit according to claim 1, wherein the first circuit includes a first resistor that is connected in series with the first switch, and includes a second resistor that is connected in parallel with the first switch and the first resistor, and
the second circuit includes a third resistor that is connected in series with the second switch, and includes a fourth resistor that is connected in parallel with the second switch and the third resistor.

4. The switch circuit according to claim 2, wherein the first resistor, the second resistor, the third resistor, and the fourth resistor each have a different resistance value.

5. A switch device comprising,
the switch circuit according to claim 1.

6. A system comprising:
the switch device according to claim 5; and
a controller configured to detect a resistance value of the switch device, and identify each of an on-state of the switch device, an off-state of the switch device, a malfunction of the first switch or the second switch, and a failure in a signal path connected to the switch device based on the resistance value of the switch device.

* * * * *